US011641171B2

(12) United States Patent
Jha et al.

(10) Patent No.: US 11,641,171 B2
(45) Date of Patent: May 2, 2023

(54) SYSTEM AND METHOD FOR GENERATING A HIGH FREQUENCY SWITCHING SIGNAL FOR A POWER CONVERTER

(71) Applicant: General Electric Company, Schenectady, NY (US)

(72) Inventors: Kapil Jha, Bangalore (IN); Olive Ray, Bangalore (IN)

(73) Assignee: General Electric Company, Schenectady, NY (US)

( * ) Notice: Subject to any disclaimer, the term of this patent is extended or adjusted under 35 U.S.C. 154(b) by 109 days.

(21) Appl. No.: 17/269,136

(22) PCT Filed: Aug. 21, 2019

(86) PCT No.: PCT/US2019/047417
§ 371 (c)(1),
(2) Date: Feb. 17, 2021

(87) PCT Pub. No.: WO2020/041412
PCT Pub. Date: Feb. 27, 2020

(65) Prior Publication Data
US 2021/0328531 A1 Oct. 21, 2021

(30) Foreign Application Priority Data
Aug. 21, 2018 (IN) .............................. 201841031357

(51) Int. Cl.
*H02P 9/00* (2006.01)
*F03D 9/25* (2016.01)
*H02M 1/088* (2006.01)
*H02M 5/458* (2006.01)

(52) U.S. Cl.
CPC ................ *H02P 9/007* (2013.01); *F03D 9/25* (2016.05); *H02M 1/088* (2013.01); *H02M 5/4585* (2013.01); *F05B 2220/706* (2013.01)

(58) Field of Classification Search
CPC ........ H02P 9/007; F03D 9/25; H02M 5/4585; F05B 2220/70
See application file for complete search history.

(56) References Cited

U.S. PATENT DOCUMENTS 4,553,198 A * 11/1985 Chan ....................... H02M 1/40
363/56.06
7,724,548 B2   5/2010 Jones et al.
(Continued)

OTHER PUBLICATIONS

PCT International Search Report & Written Opinion Corresponding to PCT/US2019/047417 dated Oct. 28, 2019.
(Continued)

*Primary Examiner* — Sean Gugger
(74) *Attorney, Agent, or Firm* — Dority & Manning, P.A.

(57) ABSTRACT

A control device (110) includes a first multiplexing unit (202) configured to segregate a first PWM signal having a first switching frequency into a second PWM signal having a second switching frequency and a third PWM signal having a third switching frequency. Also, the control device (110) includes an integrator unit (204) configured to generate a first integrated signal and a second integrated signal based on the second PWM signal and the third PWM signal, and a modulator unit (206) configured to receive the first integrated signal and the second integrated signal and generate a modulation signal based on the first integrated signal and the second integrated signal. Furthermore, the control device (110) includes a generator unit (208) configured to receive the modulation signal and generate a fourth PWM signal having a fourth switching frequency different from the first switching frequency based on the modulation signal.

23 Claims, 4 Drawing Sheets

(56) References Cited

U.S. PATENT DOCUMENTS

| | | |
|---|---|---|
| 9,537,437 B2 | 1/2017 | Wagoner et al. |
| 9,729,045 B2 | 8/2017 | Meola et al. |
| 2005/0012489 A1 | 1/2005 | Chakir |
| 2011/0140438 A1 | 6/2011 | Delmerico et al. |
| 2012/0126741 A1 | 5/2012 | El-Refaie et al. |
| 2013/0249614 A1* | 9/2013 | Zhang .................. H03K 7/08 327/175 |
| 2014/0085953 A1 | 3/2014 | Mao |
| 2014/0153287 A1 | 6/2014 | Mao |
| 2016/0191021 A1 | 6/2016 | Zhao et al. |
| 2016/0191046 A1 | 6/2016 | Zhao et al. |
| 2017/0117815 A1 | 4/2017 | Sato |
| 2017/0185130 A1 | 6/2017 | Zhang et al. |
| 2018/0191280 A1* | 7/2018 | Wagoner .............. H02M 3/335 |

OTHER PUBLICATIONS

Raj et al., Design of Boost Circuit for Wind Generator, International Journal of Scientific & Engineering Research, vol. 02, Issue 4, Apr. 1, 2011, 6 Pages. https://www.ijser.org/paper/Design_of_Boost_Circuit_for_Wind_Generator.html.

Rodriguez et al., High-Frequency PWM Buck Converters Using GaN-on-SiC HEMTs', IEEE Transactions on Power Electronics, vol. 29, Issue 5, May 2014, pp. 2462-2473. http://ieeexplore.ieee.org/abstract/document/6584005/.

Saha et al., Commercial Frequency AC to High Frequency AC Converter With Boost-Active Clamp Bridge Single Stage ZVS-PWM Inverter, IEEE Transactions on Power Electronics, vol. 23, Issue 1, Jan. 2008, pp. 412-419. http://ieeexplore.ieee.org/abstract/document/4403213/.

* cited by examiner

SYSTEM AND METHOD FOR GENERATING A HIGH FREQUENCY SWITCHING SIGNAL FOR A POWER CONVERTER

BACKGROUND

One or more embodiments of the present specification relate to power converters and more particularly to a system and a method for generating a high frequency switching signal for a power converter.

Typically, a power generation system includes a power generator, a power conversion unit coupled to the power generator, and a three-winding transformer coupled to the power conversion unit and a stator of the power generator. The power conversion unit includes a rotor-side converter and a line-side converter that are connected back-to-back via a direct current (DC) link. A primary function of the power conversion unit is to regulate active power and reactive power received from a rotor of the power generator. Further, the three-winding transformer is used to combine the power received from the power conversion unit with the power received from the stator and provide the combined power to a grid.

Usually, the three-winding transformers are bulky and occupies more space in the power generation system. The bulky transformers may in-turn increase the size of the power generation system. Also, installation of such an oversized power generation system may not be feasible at locations having space constraints.

In the conventional power generation system, a PWM generator is used to provide switching signals to the line-side converter to convert a DC voltage received from the rotor-side converter to an AC voltage. However, the PWM generator can provide only low frequency switching signals to the line-side converter, which in-turn restricts the line-side converter from generating a high voltage that is equal to the voltage provided by the stator.

Thus, there is a need for an improved system and a method for generating and providing a high frequency switching signal to a power conversion unit for generating a high voltage.

BRIEF DESCRIPTION

In accordance with aspects of the present specification, a control device is presented. The control device includes a first multiplexing unit configured to receive a first pulse width modulated (PWM) signal having a first switching frequency and segregate the first PWM signal into a second PWM signal having a second switching frequency and a third PWM signal having a third switching frequency, where the second switching frequency and the third switching frequency are less than the first switching frequency. Also, the control device includes an integrator unit coupled to the first multiplexing unit and configured to receive the second PWM signal and the third PWM signal and generate a first integrated signal and a second integrated signal based on the second PWM signal and the third PWM signal. In addition, the control device includes a modulator unit coupled to the integrator unit and configured to receive the first integrated signal and the second integrated signal and generate a modulation signal based on the first integrated signal and the second integrated signal. Furthermore, the control device includes a generator unit coupled to the modulator unit and configured to receive the modulation signal and generate a fourth PWM signal having a fourth switching frequency different from the first switching frequency based on the modulation signal.

In accordance with another aspect of the present specification, a method for changing a switching frequency of a PWM signal is presented. The method includes receiving, by a first multiplexing unit, a first PWM signal having a first switching frequency. Also, the method includes segregating, by the first multiplexing unit, the first PWM signal into a second PWM signal having a second switching frequency and a third PWM signal having a third switching frequency, where the second switching frequency and the third switching frequency are less than the first switching frequency. Further, the method includes generating, by an integrator unit, a first integrated signal and a second integrated signal based on the second PWM signal and the third PWM signal. In addition, the method includes generating, by a modulator unit, a modulation signal based on the first integrated signal and the second integrated signal. Furthermore, the method includes generating, by a generator unit, a fourth PWM signal having a fourth switching frequency based on the modulation signal, where the fourth switching frequency is different from the first switching frequency.

In accordance with yet another aspect of the present specification, a power generation system is presented. The power generation system includes a power converter configured to receive a first voltage signal. Also, the power generation system includes a control device coupled to the power converter, where the control device includes a first multiplexing unit configured to receive a first pulse width modulated (PWM) signal having a first switching frequency and segregate the first PWM signal into a second PWM signal having a second switching frequency and a third PWM signal having a third switching frequency, where the second switching frequency and the third switching frequency are less than the first switching frequency. Further, the control device includes an integrator unit coupled to the first multiplexing unit and configured to receive the second PWM signal and the third PWM signal and generate a first integrated signal and a second integrated signal based on the second PWM signal and the third PWM signal. In addition, the control device includes a modulator unit coupled to the integrator unit and configured to receive the first integrated signal and the second integrated signal and generate a modulation signal based on the first integrated signal and the second integrated signal. Furthermore, the control device includes a generator unit coupled to the modulator unit and configured to receive the modulation signal and generate the fourth PWM signal having the fourth switching frequency different from the first switching frequency based on the modulation signal.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, various embodiments of a system and a method for generating a high frequency switching signal are presented. The system disclosed herein includes a control device that enables to operate a power converter of a power generation system, such as a line-side converter at a higher switching frequency for generating a high voltage at an output of the power converter. Such an operation enables to directly couple a power link of the power converter to a stator side power link, thereby eliminating a need for a three-winding transformer in the power generation system. Size and cost of the power generation system may be substantially reduced by eliminating the need for three-winding transformers. Such a power generation system may be easily installed at locations having space constraints.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit" and "circuitry" and "controller" may include either a single component or a plurality of components, which are either active and/or passive and are connected or otherwise coupled together to provide the described function.

Figure 1:
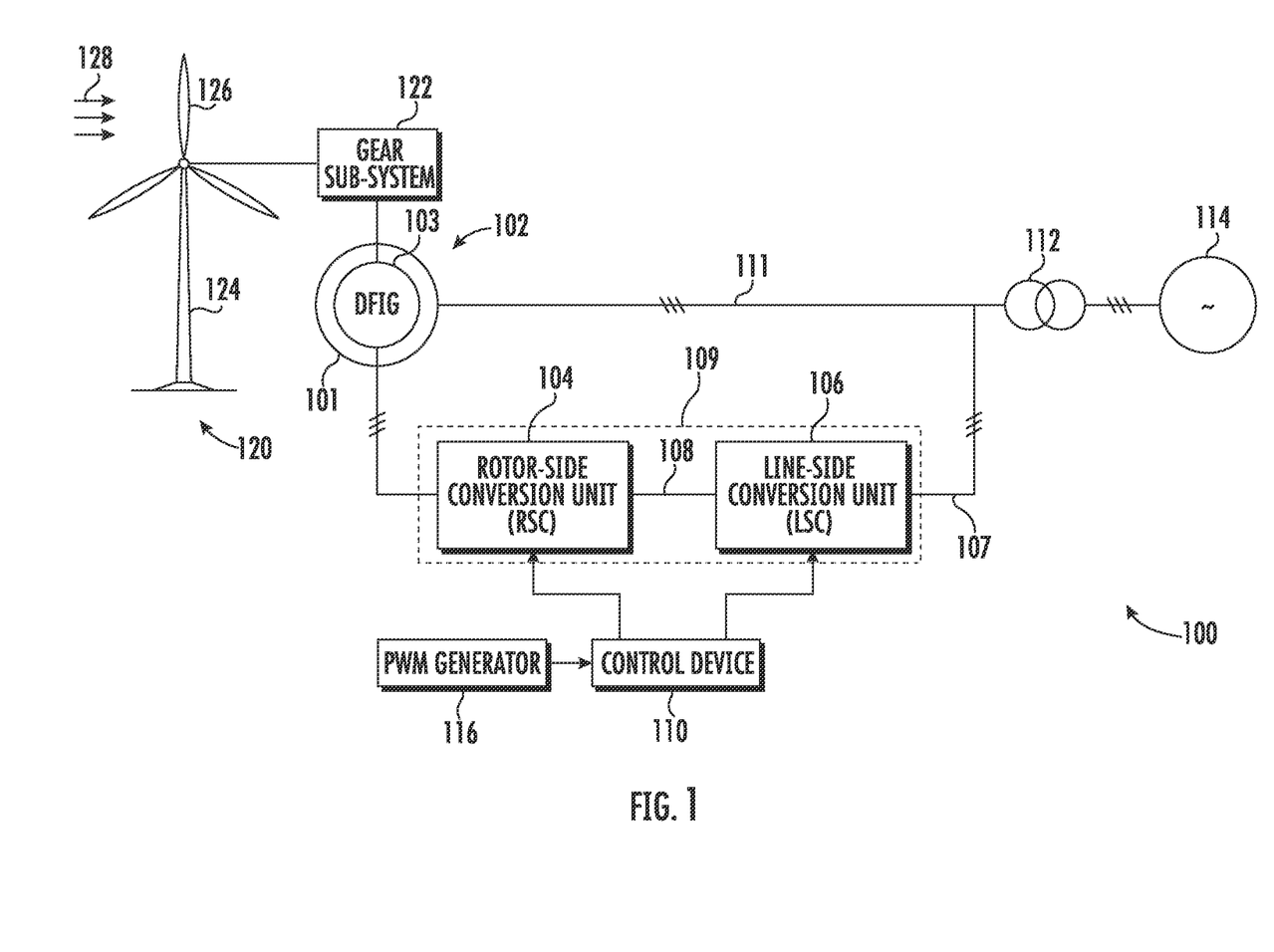
FIG. 1 is a block diagram of a power generation system in accordance with aspects of the present specification.

Turning now to the drawings and referring to FIG. 1, a block diagram of a power generation system 100, in accordance with aspects of the present specification, is depicted. The power generation system 100 includes a power generator 102 and a power conversion sub-system 109 coupled to the power generator 102. In the illustrated embodiment, the power generator 102 is a doubly-fed induction generator (DFIG) 102. It may be noted that the terms "power generator" and "DFIG" may be used interchangeably herein.

As depicted in FIG. 1, the DFIG 102 includes a stator 101 and a rotor 103 that are magnetically or inductively coupled to each other. The stator 101 has an output terminal and is configured to provide a high alternating current (AC) voltage at the output terminal. In one example, the high AC voltage may be in a range from about 1 kV to about 15 kV. Similarly, the rotor 103 has an output terminal and is configured to provide a low AC voltage at the output terminal. In one example, the low AC voltage may be in a range from about 300 V to about 800 V. It may be noted that the DFIG 102 may be used in one or more applications, such as a wind turbine to generate electric power. In one example, the generated electric power may be in a range from about 1 MW to about 5 MW. For ease of illustration, the DFIG 102 may be operatively coupled to a wind turbine 120 via a gear sub-system 122, as depicted in FIG. 1. In one embodiment, the wind turbine 120 and the gear sub-system 122 may be part of the power generation system 100 that can be referred as a wind turbine system.

In one embodiment, the wind turbine 120 includes a tower 124 and a plurality of blades 126. Moreover, the wind turbine 120 is configured to convert wind energy into mechanical energy or rotational energy. For example, kinetic energy of wind 128 passing across blades 126 of the wind turbine 120 is converted into mechanical energy. This converted mechanical energy is used to rotate a shaft coupled between the gear sub-system 122 and the DFIG 102 to generate electrical energy or electric power by the DFIG 102.

Further, the power conversion sub-system 109 includes a rotor-side conversion unit 104 and a line-side conversion unit 106 that are connected back-to-back via a direct current (DC) link 108. Each of the rotor-side conversion unit 104 and the line-side conversion unit 106 includes an AC-DC converter, a DC-AC converter, a DC-DC converter, or combinations thereof. It may be noted that the line-side conversion unit 106 may include one or more power converters. In one embodiment, the DC link 108 includes at least one capacitor. The rotor-side conversion unit 104 is coupled to the output terminal of the rotor 103 of the DFIG 102. The rotor-side conversion unit 104 receives the low AC voltage from the stator 101 and converts the low AC voltage to a low DC voltage. In one example, the low DC voltage may be in a range from about 300V to about 1 kV. Further, the line-side conversion unit 106 is coupled to the DC link 108 to receive the low DC voltage from the rotor-side conversion unit 104 and convert the low AC voltage to a high AC voltage. In one example, the high AC voltage may be in a range from about 1 kV to about 20 kV.

Furthermore, each of the rotor-side conversion unit 104 and the line-side conversion unit 106 includes a plurality of semiconductor switches (not shown). In one example, the semiconductor switches include a gallium nitride switch, a silicon carbide switch, a gallium arsenide switch, a silicon switch, or the like. The semiconductor switches are operated at a desired frequency to generate a corresponding voltage at an output terminal of each of the rotor-side conversion unit 104 and the line-side conversion unit 106. In particular, each of the semiconductor switches is activated or deactivated by a switching signal applied to a terminal of the corresponding switch. The switching signal may be referred as a pulse width modulated (PWM) signal having a plurality of switching pulses. It may be noted that the terms "switching signal" and "PWM signal" may be used interchangeably herein.

In a conventional power generation system, a signal generator, such as a PWM generator is used to provide switching signals to the switches in a line-side converter to convert a DC voltage received from a rotor-side converter to an AC voltage. However, the PWM generator can generate only low frequency switching signals, which in-turn restricts the line-side converter from generating a high voltage that is equal to a voltage provided by the stator. Consequently, a three-winding transformer is required to combine the low AC voltage received from the line-side converter with the high AC voltage received from the stator, resulting in increase of size and cost of the conventional power generation system.

To overcome the above shortcomings/problems associated with the conventional power generation system, the exemplary power generation system 100 includes an exemplary control device 110 coupled to a PWM generator 116 and the rotor-side conversion unit 104 and the line-side conversion unit 106. In particular, the control device 110 receives a low frequency switching signal from the PWM generator 116 and converts the low frequency switching signal to the high frequency switching signal. The control device 110 transmits the high frequency switching signal to the line-side conversion unit 106 which in-turn generates the high AC voltage. In one example, the PWM generator 116 may be Sine Triangle PWM generator. In one example, the low frequency switching signal is in a range from about 100 Hz to about 10 kHz, and the high frequency switching signal is in a range from about 500 kHz to about 10 MHz. It may be noted that terms "line-side conversion unit" and "power converter" may be used interchangeably herein. Also, it may be noted that the terms "low frequency switching signal" and "first PWM signal having a first switching frequency" may be used interchangeably herein. Similarly, the terms "high frequency switching signal" and "second PWM signal having a second switching frequency" may be used interchangeably herein. The aspect of converting the first PWM signal to the second PWM signal is explained in greater detail with reference to FIG. 2.

Additionally, the control device 110 controls an operation of the power conversion sub-system 109. In particular, the control device 110 controls the switching of the semiconductor switches of the rotor-side conversion unit 104 and the line-side conversion unit 106 to regulate active power and reactive power received from the rotor 103 of the DFIG 102.

Furthermore, since the line-side conversion unit 106 is capable of generating the high voltage, an output terminal 107 of the line-side conversion unit 106 is directly coupled to the output terminal 109 of the stator 101, as depicted in FIG. 1. The output terminals 107, 109 are coupled to an output device 114 via a two-winding transformer 112. The two-winding transformer 112 is used for transferring a combined voltage of the stator 101 and the line-side conversion unit 106 to the output device 114. In one example, the output device 114 may be a load such as a power consuming device. In another example, the output device 114 may be grid representative of an interconnected network of generating stations, high-voltage transmission lines, demand centers, and distribution lines for delivering electricity from suppliers to consumers. In another embodiment, the output terminals 107, 109 of the stator 101 and the line-side conversion unit 106 respectively may be directly coupled to the output device 114 without using the transformer 112. In such an embodiment, since the use of transformer 112 is avoided, the size of the power generation system can be further reduced compared to an embodiment of the power generation system 110 having the two-winding transformer 112.

Therefore, use of the exemplary control device 110 and the two-winding transformer 112 instead of a conventional three-winding transformer, facilitates to reduce the size and cost of the power generation system 100. Also, use of the control device 110 with the line-side conversion unit 106 having the semiconductor switches, facilitates to enhance efficiency of the power generation system 100.

Figure 2:
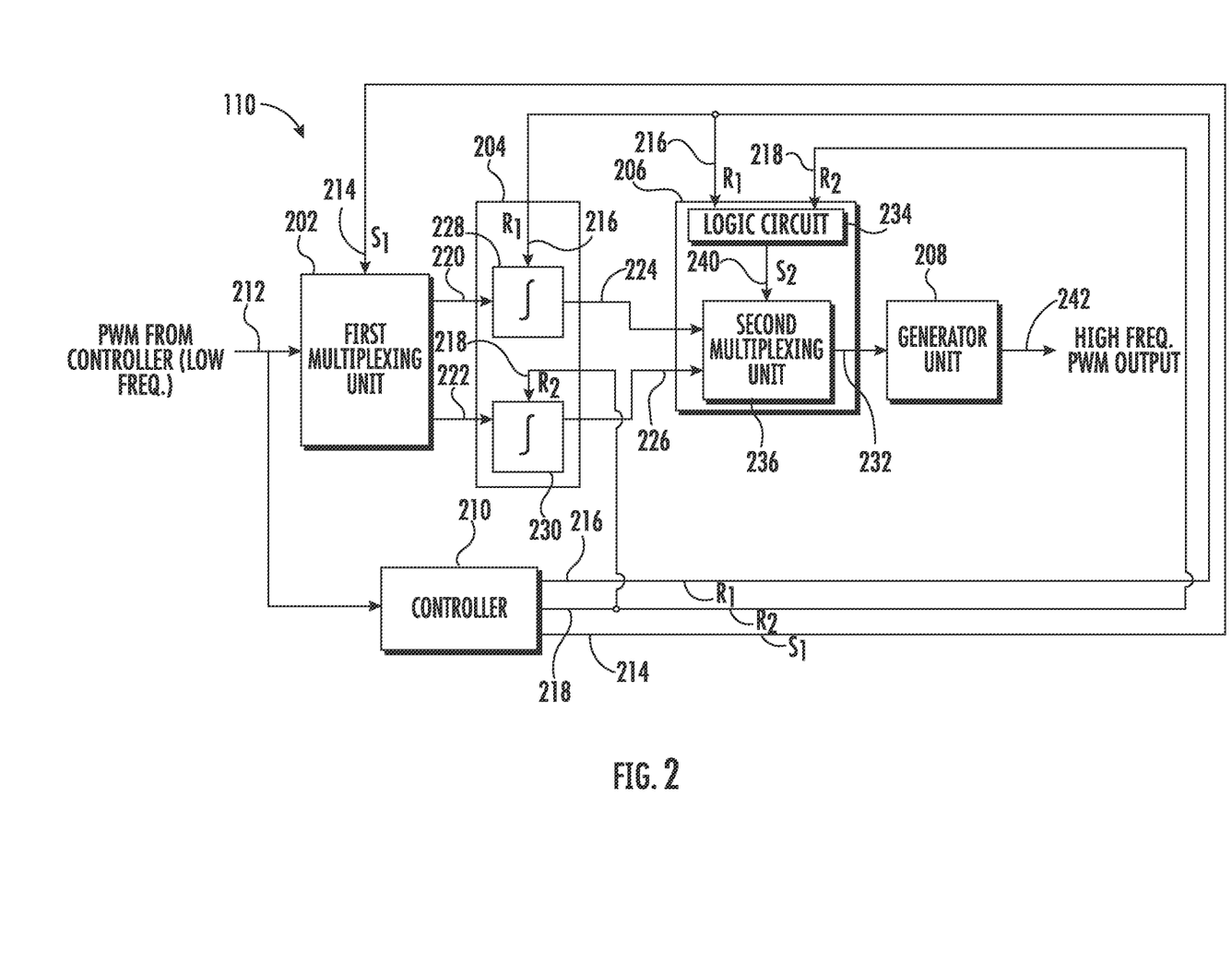
FIG. 2 is a block diagram of a control device used in the power generation system of FIG. 1, in accordance with aspects of the present specification.

FIG. 2 is a block diagram of a control device 110 of FIG. 1, in accordance with aspects of the present specification. The control device 110 includes a first multiplexing unit 202, an integrator unit 204, a modulator unit 206, a generator unit 208, and a controller 210. The first multiplexing unit 202 is operatively coupled to the integrator unit 204. Further, the integrator unit 204 is operatively coupled to the modulator unit 206 which in-turn is coupled to the generator unit 208.

The controller 210 is operatively coupled to the first multiplexing unit 202, the integrator unit 204, and the modulator unit 206.

The controller 210 is coupled to the PWM generator 116 (See FIG. 1) and configured to receive a first PWM signal 212 having a first switching frequency. It may be noted that the first PWM signal 212 having the first switching frequency is representative of a low frequency switching signal. In one example, the first switching frequency may be in a range from about 100 Hz to about 10 kHz. The controller 210 generates a first selector signal (S1) 214, a first reset signal (R1) 216, and a second reset signal (R2) 218 based on the first PWM signal 212. In particular, the controller 210 generates the first selector signal (S1) 214, the first reset signal (R1) 216, and the second reset signal (R2) 218 based on a switching frequency and a pulse width duration of the first PWM signal 212. In one embodiment, the controller 210 may include a processor, a microcontroller, a microcomputer, a programmable logic controller (PLC), a specification specific integrated circuit, specification-specific processors, digital signal processors (DSPs), Application Specific Integrated Circuits (ASICs), and Field Programmable Gate Arrays (FPGAs), integrated circuits such as integrated circuits employed in a computer, and/or any other programmable circuits. In one embodiment, the controller 210 may be pre-programmed to generate the first selector signal (S1) 214, the first reset signal (R1) 216, and the second reset signal (R2) 218 based on the first switching frequency of the first PWM signal 212. Further, the controller 210 transmits the first selector signal (S1) 214 to the first multiplexing unit 202. Additionally, the controller 210 transmits the first reset signal (R1) 216 and the second reset signal (R2) 218 to the integrator unit 204 and the modulator unit 206 respectively.

In the illustrated embodiment, the first multiplexing unit 202 is also operatively coupled to the PWM generator 116 to receive the first PWM signal 212 having the first switching frequency. Further, the first multiplexing unit 202 is configured to segregate the first PWM signal 212 into a second PWM signal 222 having a second switching frequency and a third PWM signal 220 having a third switching frequency. In one example, each of the second switching frequency and the third switching frequency may be half of the first switching frequency. If the first switching frequency is about 200 Hz, each of the second switching frequency and the third switching frequency may be about 100 Hz. As noted earlier, the first multiplexing unit 202 receives the first selector signal (S1) 214 from the controller 210. In one example, the first selector signal (S1) 214 may include a plurality of switching pulses having a predetermined duty cycle. It may be noted that the predetermined duty cycle of the first selector signal (S1) 214 is used to determine the second switching frequency of the second PWM signal 220 and the third switching frequency of the third PWM signal 222. Further, if the switching pulse of the first selector signal (S1) 214 is high or '1', the first multiplexing unit 202 generates the second PWM signal 220. Similarly, if the switching pulse of the first selector signal (S1) 214 is low or '0', the first multiplexing unit 202 generates the third PWM signal 222. In one embodiment, the switching pulses of the first PWM signal 212 are filtered based on the first selector signal (S1) 214 to generate the second PWM signal 220 and the third PWM signal 222.

Further, the first multiplexing unit 202 transmits the second PWM signal 220 and the third PWM signal 222 to the integrator unit 204. The integrator unit 204 is configured to receive the second PWM signal 220 and the third PWM signal 222 and generate a first integrated signal 224 and a second integrated signal 226 based on the second PWM signal 220 and the third PWM signal 222.

The integrator unit 204 includes a first integrator 228 and a second integrator 230. The first integrator 228 is configured to receive the second PWM signal 220 having the second switching frequency from the first multiplexing unit 202. The first integrator 228 also receives the first reset signal (R1) 216 from the controller 210. Further, the first integrator 228 is configured to integrate the second PWM signal 220 during a predefined time period to generate the first integrated signal 224. In one example, the predefined time period is determined based on the first reset signal (R1) 216 received from the controller 210. In one example, the first integrator 228 is reset for every predefined time period based on the first reset signal (R1) 216. Further, the first integrator 228 may repeatedly integrate a magnitude of the second PWM signal 220 for every predefined time period to generate the first integrated signal 224. It may be noted that the predefined time period is selected in such a way that the first integrator 228 integrates the magnitude of the second PWM signal 220 when the magnitude of the second PWM signal 220 is increasing or at a peak value. Further, if the magnitude of the second PWM signal 220 is decreasing, the first integrator 228 maintains the magnitude of the second PWM signal 220 at the peak value until the first integrator 228 is reset to repeat the integration of the magnitude of the second PWM signal 220 for a subsequent predefined time period.

The second integrator 230 is configured to receive the third PWM signal 222 having the third switching frequency from the first multiplexing unit 202. The second integrator 230 also receives the second reset signal (R2) 218 from the controller 210. In one example, the second integrator 230 is reset for every predefined time period based on the second reset signal (R2) 218. In one example, the predefined time period is determined based on the second reset signal (R2) 218 received from the controller 210. Further, the second integrator 230 may repeatedly integrate a magnitude of the second PWM signal 222 for every predefined time period to generate the second integrated signal 226. It may be noted that the predefined time period is selected in such a way that the second integrator 230 integrates the magnitude of the third PWM signal 222 when the magnitude of the third PWM signal 222 is increasing or at a peak value. Further, if the magnitude of the third PWM signal 222 is decreasing, the second integrator 230 maintains the magnitude of the third PWM signal 222 at the peak value until the second integrator 230 is reset to repeat the integration of the magnitude of the third PWM signal 222 for a subsequent predefined time period.

The integrator unit 204 transmits the first integrated signal 224 and the second integrated signal 226 to the modulator unit 206. The modulator unit 206 is configured to receive the first integrated signal 224 and the second integrated signal 226 and generate a modulation signal 232 based on the first integrated signal 224 and the second integrated signal 226. In the illustrated embodiment, the modulator unit 206 includes a logic circuit 234 and a second multiplexing unit 236. The logic circuit 234 is operatively coupled to the controller 210 to receive the first reset signal (R1) 216 and the second reset signal (R2) 218. Further, the logic circuit 234 is configured to generate a second selector signal (S2) 240 based on the first reset signal 216 and the second reset signal 218. In one example, if the first reset signal (R1) 216 is received, the logic circuit 234 generates a high switching pulse '1' of the second selector signal (S2) 240. Similarly, if the second reset signal (R2) 218 is received, the logic circuit 234 generates a low switching pulse '0' of the second selector signal (S2) 240. It may be noted that a pulse width duration of switching pulses of the second selector signal (S2) 240 is selected in such a way to combine only the peak magnitudes of the first integrated signal 224 and the second integrated signal 226.

Furthermore, the second multiplexing unit 236 is operatively coupled to the logic circuit 234 and configured to receive the second selector signal (S2) from the logic circuit 234. The second multiplexing unit 236 is also configured to receive the first integrated signal 224 and the second integrated signal 226 from the integrator unit 204. The second multiplexing unit 236 combines a peak magnitude of the first integrated signal 224 and a peak magnitude of the second integrated signal 226 based on the second selector signal (S2) 240 to generate the modulation signal 232. If the second selector signal (S2) 240 is having the high switching pulse '1', the second multiplexing unit 236 determines a peak magnitude of the first integrated signal 224. In a similar manner, if the second selector signal (S2) 240 is having the low switching pulse '0', the second multiplexing unit 236 determines a peak magnitude of the second integrated signal 226. Further, the second multiplexing unit 236 combines the peak magnitude of the first integrated signal 224 and the peak magnitude of the second integrated signal 226 to generate the modulation signal 232.

Furthermore, the generator unit 208 is coupled to the modulator unit 206 and configured to receive the modulation signal 232 and generate a fourth PWM signal 242 having a fourth switching frequency based on the modulation signal 232. The fourth switching frequency is different from the first switching frequency. In one example, the fourth switching frequency is in a range from about 500 kHz to about 10 MHz. It may be noted that the fourth switching frequency may be selected based on a voltage that the line-side conversion unit 106 (See FIG. 1) generates to match with a voltage of the stator 101 (See FIG. 1). In one embodiment, the generator unit 208 is configured to modulate a triangular carrier 235 based on the modulation signal 232 to generate the fourth PWM signal 242 having the fourth switching frequency. The fourth switching frequency is greater than the first switching frequency if a frequency of the triangular carrier 235 is greater than the first switching frequency. Similarly, the fourth switching frequency is less than the first switching frequency if the frequency of the triangular carrier 235 is less than the first switching frequency. In one example, the generator unit 208 includes a sine-triangle PWM generator. For ease of understanding of the embodiments of the invention, the fourth switching frequency is considered to be greater than the first switching frequency. It may be noted that the generator unit 208 may include any type of generator and is not limited to sine-triangle PWM generator. Thereafter, the generator unit 208 transmits the fourth PWM signal 242 having the fourth switching frequency to the line-side conversion unit 106 of the power conversion sub-system 109 for converting the low DC voltage to the high AC voltage. It may be noted that the low DC voltage received by the line-side conversion unit 106 may also be referred to as a first voltage signal having a first magnitude. Similarly, the high AC voltage generated by the line-side conversion unit 106 may be referred to as a second voltage signal having a second magnitude. It should be noted herein that the second magnitude is greater than the first magnitude.

Thus, by employing the exemplary control device 110, a low frequency switching signal or the first PWM signal 212 is converted to a high frequency switching signal or the fourth PWM signal 242. Specifically, the high frequency switching signal 242 is used to operate the line-side conversion unit 106 at a high switching frequency for generating the high voltage that is same as the voltage provided by the stator 101. As a result, the need of bulky three-winding transformers is not required.

Figure 3:
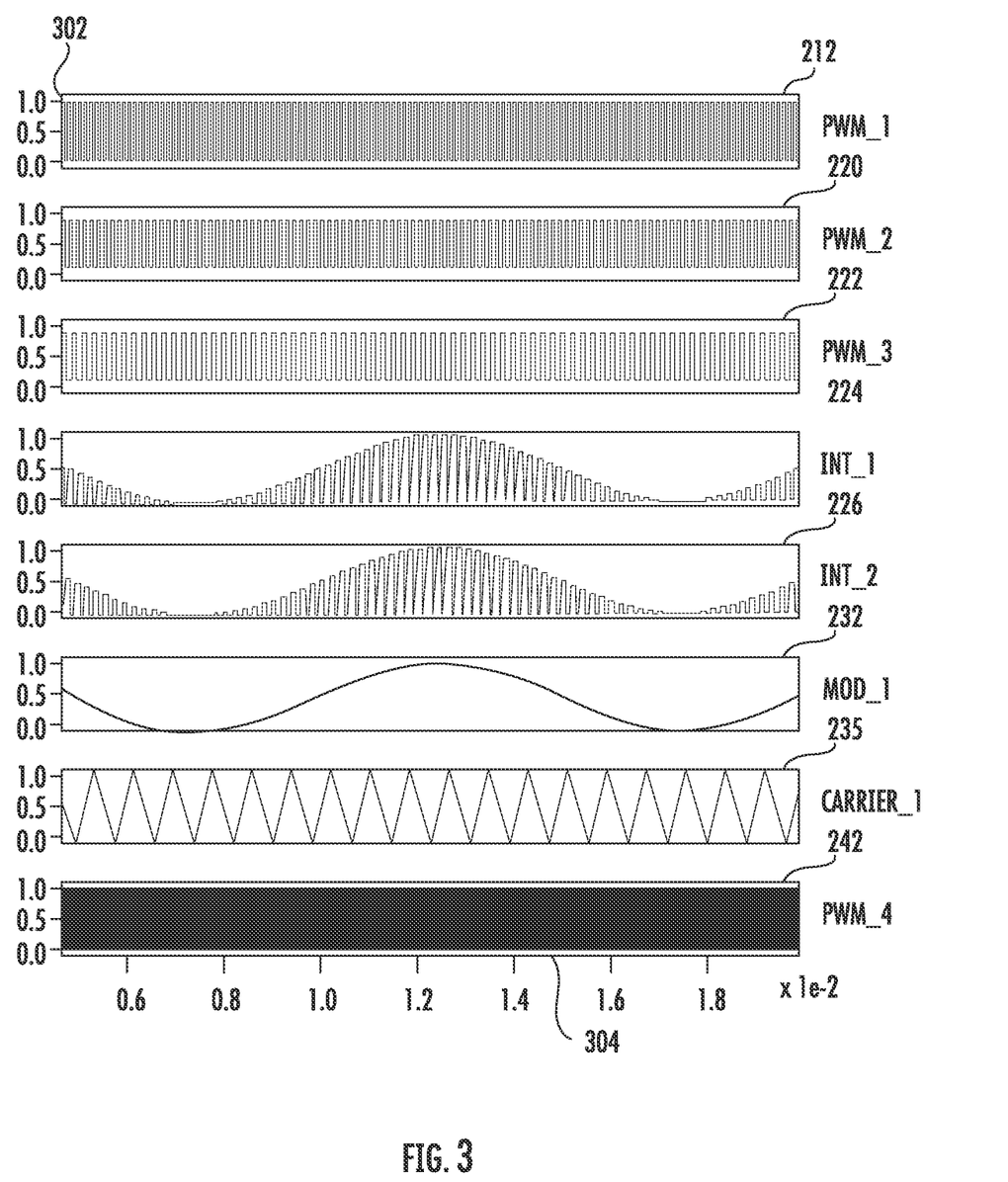
FIG. 3 is a graphical representation of pulse width modulated (PWM) signals generated at the control device of FIG. 2, in accordance with aspects of the present specification.

FIG. 3 depicts a graphical representation of different PWM signals that are plotted where Y-axis 302 is representative of magnitudes of the different PWM signals and X-axis 304 is representative of time. The reference numeral 212 is representative of the first PWM signal. Reference numeral 220 is representative of the second PWM signal and reference numeral 222 is representative of the third PWM signal. Reference numeral 224 is representative of the first integrated signal and reference numeral 226 is representative of the second integrated signal. Reference numeral 232 is representative of the modulation signal. Reference numeral 242 is representative of the fourth PWM signal having the fourth switching frequency.

Figure 4:
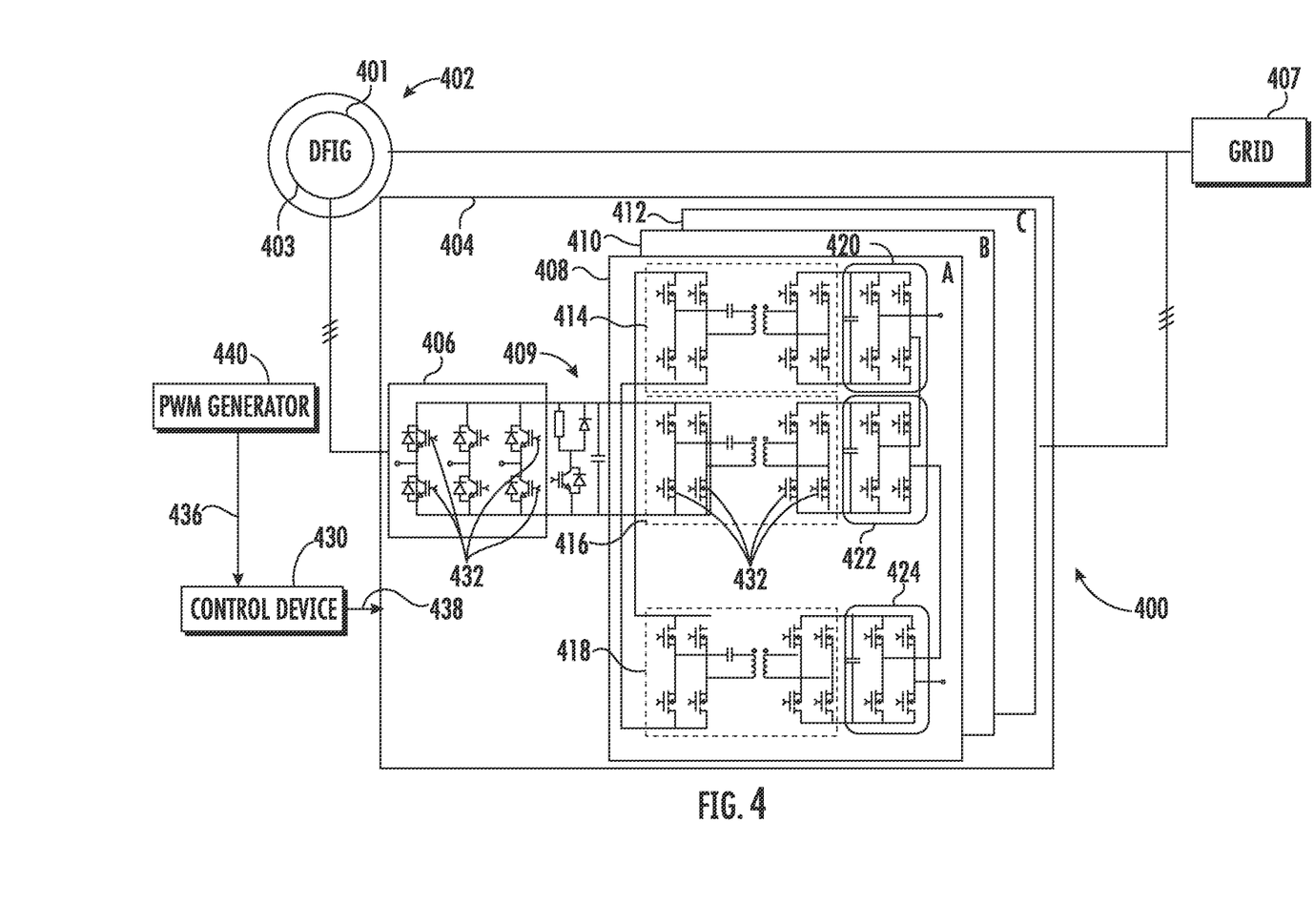
FIG. 4 is schematic representation of a power generation system in accordance with aspects of the present specification.

Referring to FIG. 4, a schematic representation of a power generation system 400, in accordance with aspects of the present specification is depicted. The power generation system 400 includes a DFIG 402 and a power conversion sub-system 404 that is coupled to the DFIG 402. It may be noted that the DFIG 402 may be similar to the DFIG 102 of FIG. 1. The DFIG 402 includes a rotor 403 and a stator 401 that are magnetically coupled to each other. Further, the rotor 403 includes a rotor winding configured to provide a low AC voltage to the power conversion sub-system 404. In one example, the low AC voltage may be in a range from about 300V to about 800 V. Similarly, the stator 401 includes a stator winding configured to provide a high AC voltage to an output device 407 such as a grid or load. In one example, the high AC voltage may be in a range from about 1 kV to about 20 kV.

In the illustrated embodiment, the power conversion sub-system 404 includes a rotor-side conversion unit 406 and a plurality of line-side conversion units 408, 410, 412. The plurality of line-side conversion units 408, 410, 412 are coupled to the rotor-side conversion unit 406 via a DC link 409. The rotor-side conversion unit 406 is operatively coupled to the rotor winding of the rotor 403. In one example, the rotor-side conversion unit 406 may be a AC-DC converter that is configured to convert the low AC voltage received from the rotor winding of the rotor 403 to the DC voltage. In one example, the low DC voltage may be in a range from about 300V to about 1 kV. Further, the line-side conversion units 408, 410, 412 are operatively coupled to the stator winding of the stator 401. Also, the line-side conversion units 408, 410, 412 and the stator 401 of the DFIG 402 are operatively coupled to the output device 407.

Further, the line-side conversion units 408, 410, 412 are coupled to each other in series to form a modular arrangement. In one example, the line-side conversion units 408, 410, 412 are disposed in a stacked configuration. Although in the embodiment of FIG. 4, only 3 line-side conversion units 408, 410, 412 are shown, in alternative embodiments, more than 4 line-side conversion units may be used to step up an output voltage generated by a combination of the line-side conversion units.

Each of the line-side conversion units 408, 410, 412 is a modular unit that that can removed or replaced by another modular unit in the power conversion sub-system 404. Advantageously, use of the plurality of line-side conversion units 408-412 in the power conversion sub-system 404 enables to increase an output voltage of the power conversion sub-system 404.

As depicted in FIG. 4, each of the line-side conversion units 408-412 includes a plurality of converters 414, 414, 416 and a plurality of inverters 420, 422, 424 operatively coupled to one other. The converters 414-416 are coupled in parallel to the DC link 409. Each of the converters 414-416 may be a DC-DC converter that is configured to ramp-up or increase the DC voltage received from the rotor-side conversion unit 406 via the DC link 409. Further, each the converters 414-416 transmits the ramped-up or high DC voltage to the corresponding inverters 420-424. In one example, the high DC voltage may be in a range from about 1 kV to 20 kV. Also, the converters 414-416 may be used to isolate the DC voltage associated with the rotor-side conversion unit 406 from the inverters 420-424.

Each of the inverters 420-424 is coupled to the corresponding converters 414-418 and configured to convert the high DC voltage received from the converters 414-418 to a high AC voltage. The high AC voltage may be equal to the AC voltage provided by the stator winding of the stator 401. In one example, the high AC voltage may be in a range from about 1 kV to about 20 kV.

Furthermore, the power generation system 400 includes a control device 430 that is operatively coupled to the power conversion sub-system 404 to control the operation of the power conversion sub-system 404. The control device 430 may be similar to the control device 110 of FIG. 2. In particular, the control device 430 is configured to control the operating frequency or switching frequency of switches 432 of the rotor-side conversion unit 406 and the line-side conversion units 408-412. More specifically, during operation of the power generation system 400, the control device 430 operates the switches 432 of the rotor-side conversion unit 406 and the line-side conversion units 408-412 between ON and OFF states to generate a desired output voltage. The term "activated state" or "ON state" refers to a condition when a switch is in an electrically conducting state. The term "deactivated state" or "OFF state" refers to a condition when a switch is in an electrically non-conducting state.

In one embodiment, the control device 430 is configured to synchronize switching of the switches 432 of the converters 414-418 of one line-side conversion unit 408 with switching of the respective switches 432 of the converters 414-418 of another line-side conversion unit 410. Further, the control device 430 is configured to synchronize switching of the switches 432 of the inverters 420-424 of one line-side conversion unit 408 with switching of the corresponding switches 432 of the inverters 420-424 of another line-side conversion unit 410.

Further, the exemplary control device 430 is configured to operate the switches 432 of the line-side conversion units 408-412 to step-up or increase the voltage provided by the rotor windings of the rotor 403. Specifically, the control device 430 is operatively coupled to a PWM generator 440 and configured to receive a first PWM signal 436 having a first switching frequency from the PWM generator 440. Further, the control device 430 is configured to convert the first PWM signal 436 having the first switching frequency to a second PWM signal 438 having a second switching frequency different from the first switching frequency. Furthermore, the control device 430 is configured to transmit the second PWM signal 438 having the second switching frequency to the switches 432 of the line-side conversion units 408-412 to operate the switches 432 at the second switching frequency. The low DC voltage received from the rotor-side conversion unit 406 is converted to the high AC voltage that is equal to the voltage generated by the stator 401 by operating the switches at the second switching frequency. The high AC voltage is combined with the voltage provide by the stator 401, and thereafter the combined voltage is provided to the output device 407. In one embodiment, the control device 430 may also send the second PWM signal 438 having the second switching frequency to the rotor-side conversion unit 406 to convert and increase the low AC voltage received from the rotor winding of the rotor 403 to the DC voltage. Further, the rotor-side conversion unit 406 provides a corresponding increased DC voltage to the line-side conversion units 408-412.

Thus, by employing the exemplary control device, the low frequency switching signal or the first PWM signal is converted to the high frequency switching signal or the fourth PWM signal. The high frequency switching signal can be used to operate the line-side conversion unit at the high switching frequency for generating the high voltage that is same as the voltage provided by the stator.

Furthermore, the foregoing examples, demonstrations, and process steps such as those that may be performed by the system may be implemented by suitable code on a processor-based system, such as a general-purpose or special-purpose computer. It should also be noted that different implementations of the present technique may perform some or all the steps described herein in different orders or substantially concurrently, that is, in parallel. Furthermore, the functions may be implemented in a variety of programming languages, including but not limited to C++ or Java. Such code may be stored or adapted for storage on one or more tangible, machine readable media, such as on data repository chips, local or remote hard disks, optical disks (that is, CDs or DVDs), memory or other media, which may be accessed by a processor-based system to execute the stored code. Note that the tangible media may comprise paper or another suitable medium upon which the instructions are printed. For instance, the instructions may be electronically captured via optical scanning of the paper or other medium, then compiled, interpreted or otherwise processed in a suitable manner if necessary, and then stored in a data repository or a memory device.

Various embodiments of a system and a method for generating a high frequency switching signal are disclosed. The system and method disclosed herein employ the exemplary the control device that aids in operating the power converters at the high switching frequency for generating the high voltage at an output of the line-side conversion unit. Such an arrangement aids in directly coupling a power link of the line-side conversion unit to the stator of the DFIG, thereby eliminating the use of bulky three-winding transformers in the power generation system. Such a power generation system may be easily installed at locations having space constraints.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof

We claim:

1. A control device comprising:
    a first multiplexing unit that receives a first pulse width modulated (PWM) signal having a first switching frequency and segregates the first PWM signal into a second PWM signal having a second switching frequency and a third PWM signal having a third switching frequency, wherein the second switching frequency and the third switching frequency are less than the first switching frequency, the first, second and third switching frequencies measured in a unit of frequency;
    an integrator unit coupled to the first multiplexing unit and configured to receive the second PWM signal and the third PWM signal and generate a first integrated signal and a second integrated signal based on the second PWM signal and the third PWM signal;
    a modulator unit coupled to the integrator unit and configured to receive the first integrated signal and the second integrated signal and generate a modulation signal based on the first integrated signal and the second integrated signal; and
    a generator unit coupled to the modulator unit and configured to receive the modulation signal and generate a fourth PWM signal having a fourth switching frequency different from the first switching frequency based on the modulation signal.

2. The control device of claim 1, further comprises a controller configured to receive the first PWM signal having the first switching frequency and generate a first selector signal, a first reset signal, and a second reset signal based on the first PWM signal.

3. The control device of claim 2, wherein the first multiplexing unit is coupled to the controller and configured to:
    receive the first selector signal and the first PWM signal having the first switching frequency from the controller; and
    segregate the first PWM signal into the second PWM signal and the third PWM signal based on the first selector signal.

4. The control device of claim 3, wherein the integrator unit comprises a first integrator configured to receive the second PWM signal having the second switching frequency and integrate the second PWM signal during a predefined time period to generate the first integrated signal.

5. The control device of claim 4, wherein the integrator unit further comprises a second integrator configured to receive the third PWM signal having the third switching frequency and integrate the third PWM signal during the predefined time period to generate the second integrated signal.

6. The control device of claim 5, wherein the modulator unit comprises a logic circuit coupled to the controller and configured to:
    receive the first reset signal and the second reset signal from the controller; and
    generate a second selector signal based on the first reset signal and the second reset signal.

7. The control device of claim 6, wherein the modulator unit further comprises a second multiplexing unit configured to:
    receive the second selector signal from the logic circuit;
    receive the first integrated signal and the second integrated signal from the integrator unit; and
    combine a peak magnitude of the first integrated signal and a peak magnitude of the second integrated signal based on the second selector signal to generate the modulation signal.

8. The control device of claim 7, wherein the generator unit is configured to modulate a triangular carrier based on the modulation signal to generate the fourth PWM signal having the fourth switching frequency.

9. The control device of claim 8, wherein the fourth switching frequency is greater than the first switching frequency if a frequency of the triangular carrier is greater than the first switching frequency.

10. The control device of claim 8, wherein the fourth switching frequency is less than the first switching frequency if a frequency of the triangular carrier is less than the first switching frequency.

11. The control device of claim 8, wherein the generator unit is configured to transmit the fourth PWM signal having the fourth switching frequency to a power converter for converting a first voltage signal to a second voltage signal.

12. A method comprising:
receiving, by a first multiplexing unit, a first pulse width modulated (PWM) signal having a first switching frequency;
segregating, by the first multiplexing unit, the first PWM signal into a second PWM signal having a second switching frequency and a third PWM signal having a third switching frequency, wherein the second switching frequency and the third switching frequency are less than the first switching frequency, the first, second and third switching frequencies measured in a unit of frequency;
generating, by an integrator unit, a first integrated signal and a second integrated signal based on the second PWM signal and the third PWM signal;
generating, by a modulator unit, a modulation signal based on the first integrated signal and the second integrated signal; and
generating, by a generator unit, a fourth PWM signal having a fourth switching frequency based on the modulation signal, wherein the fourth switching frequency is different from the first switching frequency.

13. The method of claim 12, further comprising:
receiving, by a controller, the first PWM signal having the first switching frequency; and
generating, by the controller, a first selector signal, a first reset signal, and a second reset signal based on the first PWM signal.

14. The method of claim 13, wherein segregating the first PWM signal comprises segregating the first PWM signal into the second PWM signal and the third PWM signal based on the first selector signal received from the controller.

15. The method of claim 14, wherein generating the first integrated signal and the second integrated signal comprises:
integrating, by a first integrator of the integrator unit, the second PWM signal during a predefined time period to generate the first integrated signal; and
integrating, by a second integrator of the integrator unit, the third PWM signal during the predefined time period to generate the second integrated signal.

16. The method of claim 15, wherein generating the modulation signal comprises:
receiving, by a logic circuit of the modulator unit, the first reset signal and the second reset signal from the controller;
generating, by the logic circuit, a second selector signal based on the first reset signal and the second reset signal; and
receiving, by a second multiplexing unit of the modulator unit, the first integrated signal and the second integrated signal from the logic circuit; and
combining, by the second multiplexing unit, a peak magnitude of the first integrated signal and a peak magnitude of the second integrated signal based on the second selector signal to generate the modulation signal.

17. The method of claim 16, wherein generating the fourth PWM signal comprises:
receiving, by a generator unit, the modulation signal from the second multiplexing unit; and
modulate, by the generator unit, a triangular carrier based on the modulation signal to generate the fourth PWM signal having the fourth switching frequency.

18. The method of claim 17, wherein the fourth switching frequency is greater than the first switching frequency if a frequency of the triangular carrier is greater than the first switching frequency.

19. The method of claim 17, wherein the fourth switching frequency is less than the first switching frequency if a frequency of the triangular carrier is less than the first switching frequency.

20. The method of claim 12, further comprising:
providing, by a doubly-fed induction generator (DFIG) coupled to a wind turbine, a first voltage signal to a power converter; and
transmitting, by the generator unit, the fourth PWM signal having the fourth switching frequency to the power converter for converting the first voltage signal to a second voltage signal.

21. A power generation system, comprising:
a power converter configured to receive a first voltage signal; and
a control device coupled to the power converter, wherein the control device comprises:
a first multiplexing unit receiving a first pulse width modulated (PWM) signal having a first switching frequency and segregating the first PWM signal into a second PWM signal having a second switching frequency and a third PWM signal having a third switching frequency, wherein the second switching frequency and the third switching frequency are less than the first switching frequency, the first, second and third switching frequencies measured in a unit of frequency;
an integrator unit coupled to the first multiplexing unit and configured to receive the second PWM signal and the third PWM signal and generate a first integrated signal and a second integrated signal based on the second PWM signal and the third PWM signal;
a modulator unit coupled to the integrator unit and configured to receive the first integrated signal and the second integrated signal and generate a modulation signal based on the first integrated signal and the second integrated signal; and
a generator unit coupled to the modulator unit and configured to receive the modulation signal and generate the fourth PWM signal having the fourth switching frequency different from the first switching frequency based on the modulation signal.

22. The power generation system of claim 21, further comprises:
a wind turbine; and
a doubly-fed induction generator (DFIG) operatively coupled to the wind turbine and configured to provide the first voltage signal to the power converter.

23. The power generation system of claim 21, wherein the generator unit is configured to transmit the fourth PWM signal having the fourth switching frequency to the power converter for converting the first voltage signal to a second voltage signal.

* * * * *